United States Patent [19]

Hu et al.

[11] Patent Number: 5,196,381
[45] Date of Patent: Mar. 23, 1993

[54] METAPHOSPHATE GLASS COMPOSITION

[75] Inventors: Yung-Haw Hu, Hockessin, Del.; Michael A. Saltzberg, Glen Mills, Pa.; Robert D. Shannon, Wilmington, Del.

[73] Assignee: E. I. Du Pont de Nemours and Company, Wilmington, Del.

[21] Appl. No.: 465,403

[22] Filed: Jan. 16, 1990

[51] Int. Cl.$^5$ .............................................. C03C 10/2
[52] U.S. Cl. ........................................ 501/10; 501/32; 501/46; 501/47; 501/48; 501/73; 501/77; 501/78; 501/20
[58] Field of Search .................. 501/46, 47, 48, 73, 501/77, 78, 32, 10, 20

[56] References Cited

U.S. PATENT DOCUMENTS

| | | | |
|---|---|---|---|
| 3,519,445 | 7/1970 | Mac Dowell et al. | 106/39 |
| 4,026,714 | 5/1977 | Lewis | 501/48 |
| 4,105,577 | 8/1978 | Yamashita | 501/48 |
| 4,833,104 | 5/1989 | MacDowell et al. | 501/10 |
| 4,849,379 | 7/1989 | McCormick | 501/32 |
| 4,849,380 | 7/1989 | Sawhill | 501/32 |
| 4,883,705 | 11/1989 | Kawakami et al. | 501/32 |

FOREIGN PATENT DOCUMENTS 0262974 4/1988 European Pat. Off. .
2087352 12/1971 France .

OTHER PUBLICATIONS

*Patent Abstracts of Japan*, vol. 12, No. 132 (C-490) (2979), published Nov. 4, 1987, "Sintered Glass and Sintered Glass Ceramic".
Derwent Publications Ltd., Accession No. 88-334852, 1987.
Lisitsyna, et al., *Soviet Journal of Glass Physics and Chemistry* "Thermophysical and Some Physicomechanical Properties of Glasses of the $Zn(PO_3)_2$-AL($PO_3)_3$-$Y(PO_3)_3$ System," vol. 13, No. 3, Jun., 1987, pp. 197-201.

Primary Examiner—Mark L. Bell
Assistant Examiner—Deborah Jones

[57] ABSTRACT

A low-K crystallizable glass composition having a softening point of 550°-800° C., consisting essentially of mole % of:
41-70% $P_2O_5$;
10-48% MgO, ZnO or mixtures thereof;
2-20% $Al_2O_3$, $Cr_2O_3$ or mixtures thereof;
0-10% alkali metal oxide(s);
0-10% CaO, SrO, BaO or mixtures thereof;
0-10% $SiO_2$;
0-20% $B_2O_3$;
0-10% $ZrO_2$, $TiO_2$ or mixtures thereof; and
0-10% $Fe_2O_3$, with the provisos that:
(i) $a = n(b+3c+d+e+2f+3g)$, wherein $n = 0.8$–$1.0$, and
  $a$ = mole % $P_2O_5$;
  $b$ = mole % MgO, ZnO or mixtures thereof;
  $c$ = mole % $Al_2O_3$, $Cr_2O_3$ or mixtures thereof;
  $d$ = mole % $M_2O$, where M = Na, K, Rb, Cs
  $e$ = mole % M'O, where M' = Ca, Sr, Ba
  $f$ = mole % $ZrO_2$, $TiO_2$ or mixtures thereof;
  $g$ = mole % $Fe_2O_3$, (where Ln is any of the rare earth elements), or mixtures thereof;
(ii) the total amount of alkali oxides, CaO, SrO, and BaO does not exceed 10 mole %;
(iii) the total amount of $ZrO_2$, $TiO_2$, and $Fe_2O_3$ does not exceed 10 mole %.

4 Claims, No Drawings

METAPHOSPHATE GLASS COMPOSITION

FIELD OF INVENTION

The invention relates to metaphosphate glass compositions and in particular to such glasses which are crystallizable under thick film or tape firing conditions, and to glass-ceramic or filled glass-ceramic composites based on these glasses.

BACKGROUND OF THE INVENTION

It is well known that circuit packaging can have profound effects on the properties of integrated circuits (ICs). Lowering the dielectric constant (K) of the substrate materials in ICs increases circuit speed, reduces power consumption and also minimizes electronic cross-talk, thus allowing for higher functional density. Polymeric materials typically offer lower dielectric constants than ceramic materials, but for many applications the reliability and superior thermal conductivity of ceramic packages make them more desirable. The low-K ceramic dielectrics currently used are predominantly filled glass systems in which the glass is typically a borosilicate composition such as that disclosed in JP 62,138,357 or an aluminosilicate such as that disclosed in JP 62,150,856. Systems of this type have caused some reliability and/or yield problems because of phenomena such as conductor blistering, staining and conductor "swimming" (spreading across the surface of the part). Dimensional control during re-firing is also a frequent concern. In addition, the inclusion of alkali ions, commonly used to lower glass viscosity, also produces glasses having significant ionic conductivity and can lead to electrolytic reactions and/or high dielectric losses.

One approach to reducing the reactivity of the dielectric systems is the use of crystallizable glasses. These materials, if correctly designed, will first sinter to a hermetic body and then crystallize during the firing process. During subsequent firings to complete the processing of the circuit, the mostly crystalline substrate is chemically and mechanically more stable than conventional filled glass substrates. Crystalline materials also typically have higher thermal conductivity and higher mechanical strengths than amorphous materials. Desirable properties for candidate crystallizable glass-based systems would include low dielectric constants and losses, coefficients of thermal expansion (TCE) matched to 96% alumina (6.2 ppm/° C.) or silicon (3.5 ppm/° C.), hermetic sintering and crystallization upon firing to 850°–900° C. to facilitate their use with precious metal conductors. The TCE of the dielectric system can be matched to alumina or silicon by use of appropriate fillers such as cordierite (to lower TCE) or $AlPO_4$ (to raise TCE).

SUMMARY OF THE INVENTION

The invention is directed in its primary aspect to a low-K crystallizable glass composition having a softening point of 550°–800° C. and a dielectric constant less than about 5.8, consisting essentially by mole % of:
41–70% $P_2O_5$;
10–48% MgO, ZnO or mixtures thereof;
2–20% $Al_2O_3$, $Cr_2O_3$ or mixtures thereof;
0–10% alkali metal oxide(s);
0–10% CaO, SrO, BaO or mixtures thereof;
0–10% $SiO_2$;
0–20% $B_2O_3$;
0–10% $ZrO_2$, $TiO_2$ or mixtures thereof; and
0–10% of metal oxides selected from $Fe_2O_3$ and rare earth metal oxides with the provisos that:
(i) $a = n(b + 3c + d + e + 2f + 3g)$, wherein $n = 0.8–1.0$, and
a = mole % $P_2O_5$;
b = mole % MgO, ZnO or mixtures thereof;
c = mole % $Al_2O_3$, $Cr_2O_3$ mixtures thereof;
d = mole % $M_2O$, where M = Na, K, Rb, Cs
e = mole % M'O, where M' = Ca, Sr, Ba
f = mole % $ZrO_2$, $TiO_2$ or mixtures thereof;
g = mole % $Fe_2O_3$ and rare earth metal oxides
(ii) the total amount of alkali oxides, CaO, SrO, and BaO does not exceed 10 mole %;
(iii) the total amount of $ZrO_2$, $TiO_2$, $Fe_2O_3$, and rare earth metal oxides does not exceed 10 mole %.

DETAILED DESCRIPTION OF THE INVENTION

The glasses of the invention are crystallizable metaphosphate glasses which, upon firing, form crystalline phases such as $MgP_2O_6$ and/or $AlP_3O_9$.

Because the glasses of the invention are intended for use in low-K dielectric systems, they should have the following characteristics in order to meet the functional requirements of low-K dielectric systems.

| System Requirements | Glass Requirements |
| --- | --- |
| Hermeticity after firing at 850–950° C. | Deformation point <800° C. Compatibility with fillers |
| Good binder burnout | Deformation point >550° C. |
| TCE-matched to alumina or Si | TCE >6.2 ppm/°C. for alumina, >3.5 ppm/°C. for Si |
| Microstructure stable to multiple firings | Crystallizable |
| Negligible ionic mobility | No alkali metals, Pb, etc. |
| Low-K (<5.8), low dielectric loss (<0.5%) | Low-K, formation of low loss crystalline phases |
| Good chemical durability | Durable glass |

In order to form predominantly crystalline metaphosphates (phases which are desirable because of their relatively low dielectric constants) upon heat treatment of the glasses, it is important to maintain the modifier: $P_2O_5$ ratio close to that of the metaphosphate composition, i.e. $M^{n+}(PO_3)_n$. The proportion of $P_2O_5$ in the glasses of this invention has thus been defined as 80–100% of that needed to maintain the metaphosphate stoichiometry for a given combination of glass modifiers. Greater $P_2O_5$ concentrations than those specified lead to non-crystallizable, hygroscopic glasses, while compositions containing less $P_2O_5$ than specified form large amounts of phases other than the low-K metaphosphates upon crystallization or cannot be obtained as glasses. The preferred range for the $P_2O_5$ content is 90–100% of that needed to maintain the metaphosphate stoichiometry, since these compositions typically yield crystallized glasses where the only phases are residual glass and the crystalline metaphosphates. The small amounts of other phases formed in the glasses with 80–90% of the $P_2O_5$ needed for the metaphosphate stoichiometry, although they raise K slightly, do not destroy the essential advantages of the crystallizable glasses.

The choice of glass modifiers controls the dielectric constant, TCE, and softening points of the metaphosphate glasses. The glasses of the invention are mainly based on MgP$_2$O$_6$ (which can be partially or fully replaced by ZnP$_2$O$_6$) and AlP$_3$O$_9$ (which can be partially or fully replaced by CrP$_3$O$_9$). Moderate concentrations of Al$_2$O$_3$ or Cr$_2$O$_3$ improve the glass chemical stability and raise the viscosity. When the concentration of Al$_2$O$_3$ (or Cr$_2$O$_3$) in the glasses is greater than about 20 mole %, the softening points of the glasses are too high to allow densification of multilayer electronic packages at the desired firing temperatures of 850°-950° C. When the concentration of Al$_2$O$_3$ is less than 5 mole %, the glasses have lower chemical durability. The preferred compositions containing 10-17 mole % Al$_2$O$_3$ and 17-30 mole % MgO provide the most advantageous balance of acceptable softening points and chemical durability.

Additions of alkali and alkaline earth oxides other than BeO and MgO lower the glass softening temperature, and increase TCE and dielectric constant of the glass. These oxides can be added to the glasses in amounts of up to about 10 mole % without adversely affecting other properties, so long as the specified phosphate stoichiometry is maintained. When the concentration of these oxides is greater than about 10 mole %, the dielectric constant of the glass is higher than generally desired for the electronic packaging applications and chemical stability is reduced.

ZrO$_2$, TiO$_2$, Fe$_2$O$_3$, and any of the rare earth elements can be added to the glasses in amounts of up to 10 mole % to raise viscosity and to improve chemical stability without adversely affecting the other properties of the glass, so long as the specified phosphate stoichiometry is maintained. These oxides have the effects of raising the softening point and dielectric constant of the glasses, and of lowering the TCE of the glasses. Glasses containing greater than 10 mole % of these oxides tend to have softening points and dielectric constants greater than those desired for electronic packaging applications.

SiO$_2$ can be added to the glasses in amounts of up to 10 mole %. The addition of silica to the glass increases the temperature separation between glass softening point and the crystallization temperature, and also ensures the formation of a small amount of residual glass. This residual glass, which increases with the silica content, improves the hermeticity of the fired packages. SiO$_2$ concentrations greater than about 10% inhibit the crystallization of the glasses to an extent larger than that desired. Preferred compositions contain about 1-5 mole % SiO$_2$, since these have the desired amount (about 2-15 volume %) of residual glass upon crystallization.

B$_2$O$_3$ can be added to the glasses in amounts of up to 10 mole % without greatly affecting the essential properties of the glasses. When the B$_2$O$_3$ concentration exceeds about 10 mole %, the chemical durability of the glasses is adversely affected, and the crystallization of the glasses can be inhibited.

The glasses of this invention are designed to be crystallizable. The identity of the crystalline phases formed depends on the composition of the glass. Typically, MgP$_2$O$_6$ and AlP$_3$O$_9$ are the dominant crystalline phases formed upon heat treatment of the glasses in the temperature range 850°-950° C., and, for the best mode of practicing this invention disclosed below, these are the only crystalline phases observed. When other glass modifiers are included, the crystalline metaphosphates of these modifiers may also form. For example, ZnP$_2$O$_6$ may be observed if ZnO is included in the composition of the glass and CrP$_3$O$_9$ may be observed if Cr$_2$O$_3$ is included in the glass composition. When the P$_2$O$_5$: modifier ratio is less than about 90% of that needed to maintain the metaphosphate stoichiometry, other crystalline phases such as pyrophosphates or orthophosphates may be observed. Examples of these phosphate-poor phases are Mg$_2$P$_2$O$_7$ and AlPO$_4$.

When no glass formers other than P$_2$O$_5$ are added to the composition, the glasses may crystallize almost completely, leaving little or no residual glass. The inclusion of SiO$_2$ in the glass composition increases the amount of residual glass. For the compositions specified in this invention, the amount of residual glass varies from about 0-35 volume % when the glasses are annealed at 850°-950° C. Higher temperature heat treatments lead to a greater degree of crystallization for a given glass composition, while the inclusion of greater amounts of silica leads to a larger amount of residual glass. The residual glass is richer in silica than the original glass composition, since the crystallization of the metaphosphate phases concentrates the SiO$_2$ in the residual glass.

Since the modifier: P$_2$O$_5$ ratio is of critical importance to the essential properties of this invention, it is important to control the loss of volatile P$_2$O$_5$ during glass melting. The volatilization of P$_2$O$_5$ from glass melts is a well-known phenomenon. It has been found that using the crystalline metaphosphates as raw materials substantially reduces the loss of P$_2$O$_5$ during glass melting, as compared with the use of traditional sources of P$_2$O$_5$ such as ammonium hydrogen phosphate or phosphoric acid. The use of crystalline metaphosphates as raw materials for the glass melts allows better control of the phosphate stoichiometry and thus of the properties of the glasses.

The glasses of this invention can be used alone or they can be combined with appropriate ceramic or glass fillers to form composite materials. The primary advantage of fillers is that these materials can be used to match the TCE of the composite system to that of other components in the electronic package such as alumina substrates or silicon chips. Secondary advantages are that lower dielectric constants or higher mechanical strengths may be achieved in the composites. Our preferred filler for the metaphosphate glasses of this invention is crystalline AlPO$_4$ (berlinite). As shown in the Examples, other fillers can be used to match either high- or low-TCE packaging applications. Some of these fillers include, but are not limited to, fused silica, quartz, AlP$_3$O$_9$, cordierite, mullite, AlN, and BN.

Our preferred range of glass compositions depends upon the type of metallization used in the specific packaging application. When silver is used as the conductor in the package, the firing temperature used in the processing of the package is typically 850°-900° C. To achieve the desired densification and crystallization of the dielectric layer during short firing times at these temperatures, glasses with softening points below about 750° C. are typically required. The actual softening point required varies with the sintering properties and loading of the fillers used in the composite dielectric. For firing temperatures of 850°-900° C., the preferred compositions contain 10-14 mole % Al$_2$O$_3$, 20-30 mole % MgO, 0-5 mole % SiO$_2$, and 54-62 mole % P$_2$O$_5$, where the mole % P$_2$O$_5$=n(3a+b) and n=0.9-1.0, a=mole % Al$_2$O$_3$, and b=mole % MgO. These glasses have appropriate softening points and crystallization temperatures for processing at 850°-900° C.

When copper metallization is used in the packaging application, processing temperatures are typically 900°–950° C. To achieve the desired densification and crystallization of the dielectric layer during short firing times at these temperatures, glasses with softening points below about 800° C. are typically required. The actual softening point required varies with the sintering properties and loading of the fillers used in the composite dielectric. For these applications, the preferred compositions contain 13–17 mole % $Al_2O_3$, 17–21 mole % MgO, 0–5 mole % $SiO_2$, and 55–65 mole % $P_2O_5$, where the mole % $P_2O_5 = n(3a+b)$ and $n=0.9–1.0$, $a=$ mole % $Al_2O_3$, and $b=$ mole % MgO. These glasses have appropriate softening points and crystallization temperatures for processing at 900°–950° C.

In general, the preferred compositions contain 10–17 mole % $Al_2O_3$, 17–30 mole % MgO, 0–5 mole % $SiO_2$, and 54–65 mole % $P_2O_5$, where the mole % $P_2O_5 = n(3a+b)$ and $n=0.9–1.0$, $a=$ mole % $Al_2O_3$, and $b=$ mole % MgO. Other constituents are preferably absent, although they may be included at moderate levels without destroying the essential properties of the glasses. The preferred mode for practicing the invention uses mixtures of the abovementioned glasses with 30–60 volume % of a filler with a low dielectric constant in the form of a thick film paste or slip-cast tape. The preferred filler for these applications is $AlPO_4$ (berlinite).

The glass compositions of the invention will ordinarily be applied either as thick film pastes or as dielectric green tapes. In the former case, the finely divided glass particles, either with or without fillers, are dispersed in an organic medium consisting of an organic polymer dissolved in a volatilizable solvent. The dispersions are of paste consistency and are capable of being screen printed. A typical organic medium for thick film applications is a solution of a cellulosic polymer in beta-terpineol. In the case of green tape, the finely divided glass particles, either with or without fillers, are dispersed in a matrix of solid organic polymer. The polymeric binder for such green tapes is ordinarily chosen because of its good burnout characteristics. Acrylic polymers such as polymethacrylates are frequently chosen for this purpose. The tapes are prepared by casting a slip comprising the finely divided glass particles, polymer binder, plasticizers for the binder polymer if they are used, and volatile solvent, which is removed by evaporation. The preparation of ceramic green tapes by slip casting is described in detail in Usala, U.S. Pat. No. 4,536,535.

Best mode of the invention involves the use of a composite thick film or slip cast tape system containing 40 weight % of berlinite ($AlPO_4$) and 60 weight % of a glass with the following composition:
59 mole % $P_2O_5$
24 mole % MgO
12 mole % $Al_2O_3$
5 mole % $SiO_2$
This combination of glass and filler, disclosed in Example #48, can be used in either thick film or tape form to yield components for electronic packaging.

Test Procedures

A. Thermal Properties of Glass

The thermal expansion coefficients, glass transition temperatures, and dilatometric softening points of the glasses were obtained using a standard thermo-mechanical analyzer (TMA). Glass pieces, cut to approximately 10 mm length, were used in the TMA experiments run from room temperature to about 800° C. at 5° C./minute.

The peak crystallization temperatures were determined with differential thermal analysis (DTA) at 20° C./minute and phases formed upon devitrification of the glasses were determined by high-temperature X-ray diffraction.

Abbreviations

The following abbreviations are used herein with respect to the physical properties of glasses:
$T_c=$ crystallization temperature
$T_d=$ deformation temperature or dilatometer softening point
$T_g=$ glass transition temperature
TCE = temperature coefficient of expansion, ppm/°C.
K = dielectric constant
tan d = dielectric loss tangent

B. Chemical Durability (Water Leach Test)

Chemical durability is determined in accordance with ASTM C-225, Method P-W. This method allows the determination of the resistance of powder samples to attack by water at 25 psi (175 kPa) and a temperature of 120° C. The water soluble component was separated from the insolubles and phosphate contents were determined. The phosphate content is deemed to be indicative of the relative durability of the phosphate glasses, and is given as mg $P_2O_5$ dissolved/g of glass.

C. Hermeticity

The hermeticity of the fired dielectric films is measured using leakage current testing. The test determines the average leakage current developed when a D. C. voltage is applied across an electrode layer and a saline solution in which the test part is immersed. This technique correlates the hermetic integrity with the dielectric composition. The leakage current test procedures consist of the following:
1. Screen pattern D-12 (325 mesh/0.0279 mm wire dia.) is printed with conductor pastes on 5.08 cm ×96% alumina substrates. The prints are examined under an optical microscope to assure the absence of visible surface defects.
2. The printed conductors are dried in an oven at 150° C. for 10 mins. and fired using a belt furnace.
3. Screen pattern D-14 (200 mesh/0.0406 mm mil wire dia.) is printed with the test dielectric using a double wet-pass onto the fired conductor pattern.
4. The samples are oven dried at 150° C. for 10 mins. and fired in a belt furnace.
5. Steps 4–6 are repeated with a second dielectric layer.
6. The test parts are inserted into prewired connectors and placed vertically into a beaker of 0.1N NaCl solution.
7. With the Pt electrode immersed in the solution and spaced 2.54 cm away from the test sample, the D. C. power supply is connected with positive terminal to anode, and negative terminal to connector containing test part.
8. With 10 Volts D. C. between connector and anode electrode, the leakage current is measured after 5 mins at voltage.

Leakage currents in the range of 0.1 uA to 0.01 uA have been measured for dielectric thick films with compositions of 60 wt. % $AlP_3O_9/MgP_2O_6/SiO_2$ glass + 40 wt.

% fused SiO$_2$ and 60 wt. % AlP$_3$O$_9$/MgP$_2$O$_6$/SiO$_2$+30 wt. % fused SiO$_2$+10 wt. % quartz.

D. Dielectric Constant and Loss

Ceramic specimens are evaluated using the following procedure. Sample dimensions are measured with a digital gauge capable of measuring 0.0001 cm. Sample thickness is measured at 4 positions on the circumference and in the center. Typical ceramic specimens consist of sintered discs of diameter 10 mm and thickness approximately 1 mm. Sputtered gold electrodes are applied using a Denton Vacuum (2 Pinoak Ave., Cherry Hill, N.J., 08003) Desk II sputtering unit. The electrodes are applied over the entire parallel surfaces of the sample using a masking technique. Precautions are taken to avoid the presence of electrode material at the edge of the sample.

Dielectric constant measurements are performed with a parallel plate capacitance technique using Hewlett-Packard (P. O. Box 10301, Palo Alto, Calif. 94303-0890) 4274A and 4275A LCR bridges and fixture 16034B (Test Tweezers) according to the procedure described by Subramanian et al. (Phys. Chem. Minerals 16,741, 1989).

Edge capacitance is calculated from an expression derived from data on standard fused silica, CaF$_2$, and SrF$_2$ (Subramanian et al., 1989):

$$C_e = (0.019 \ln P/t - 0.043)P$$

where P and t are sample perimeter and thickness in cm. Actual capacitance, from which the dielectric constant is calculated, is obtained by subtracting the calculated edge capacitance from the apparent sample capacitance.

The accuracy of the dielectric constant measurements using the above techniques was determined from a series of measurements on standard fused silica. The values observed in these measurements are 3.836±0.05 for silica compared to 3.826±0.011 from Bussey et al. (IEEE Trans. on Instrumentation and Measurement, Vol. IM-13: 305-311, 1964), 6.814±0.07 for CaF$_2$ compared to 6.799±0.0007 from Andeen et al. (J. Appl. Phys. 42: 2216-2219, 1971), and 6.463±0.09 for SrF$_2$ compared to 6.4655 from Andeen et al. Thus, the accuracy and precision in the measurement of K for samples having areas of 0.05-1.0 cm$^2$ is 0.5-1.5%. The largest errors are probably associated with irregularities in sample geometry. Although the error in dielectric loss (tan d) specified by Hewlett-Packard is ±0.0016-0.0026, in practice the errors associated with the HP4274A and HP4275A LCR bridges are closer to ±0.0004. These bridges measure losses of doped alkaline earth fluorides at levels of 0.002 with errors of 5-20% and at levels of 0.0004-0.0005 with errors of 50-100%.

E. Mixed Metal Conductor Compatibility

The purpose of this test is to determine whether an electrolytic reaction occurs between gold and silver electrodes through the thick film dielectric layer. Mixed metallurgy tests have been performed using two metaphosphate dielectric pastes with Au and Ag pastes having metaphosphate glass as a binding agent. First, gold paste was screen printed on 5.08 cm×5.08 cm 96% alumina substrate. The sample was fired in a belt furnace. Two layers of dielectric films were printed and fired on the top of the Au pattern. Finally, a Ag film was put on top of the second dielectric film. All the firings were accomplished at 850° C. No blistering and delaminations of conductors must be detected after 20 refirings.

Glass Melting Procedure

The following procedure was used to prepare the glasses of the invention:

Crystalline powders of the raw materials, typically MgP$_2$O$_6$, AlP$_3$O$_9$, various metal oxides or carbonates, H$_3$PO$_4$ (86% by weight aqueous solution), and (NH$_4$)$_2$HPO$_4$, were ground for 15-30 minutes in an agate automatic mortar grinder. The well-mixed powders were then loaded into alumina crucibles fitted with alumina lids, and melted at 1300°-1550° C. for 15-60 minutes. The melts were then quenched to room temperature by pouring them onto polished steel plates. The glass patties thus obtained were clear and free from visible inclusions, and had few or no bubbles.

EXAMPLES 1-4 (GLASS MELTING)

A. Conventional Methods

In the preparation of phosphate glasses by conventional techniques, either ammonium dihydrogen phosphate or phosphoric acid is used as the source of P$_2$O$_5$. Typically, (NH$_4$)H$_2$PO$_4$ is ground together with the metal oxides or carbonates, and pre-reacted using a slow temperature increase, typically less than 1° C./min, to 550, and held at this temperature for about 12 hours. Faster rates tend to cause foaming. Silica or other additives can be added during the original mixing or during re-grinding of the pre-reacted mix. The glasses are melted in covered alumina crucibles at 1300-1450° C. for 30 minutes. A major problem with this method is that volatile P-containing species can be lost during the pre-reaction process, resulting in off-stoichiometric melts. Furthermore the pre-reaction process is too long.

B. Use of Crystalline Metaphosphates

In formulating the glasses of the invention, it is preferred to use the crystalline metaphosphates as raw materials. This is the best method for reproducibly making phosphate glass compositions. Chemically binding the P$_2$O$_5$ in the metaphosphate structure minimizes P$_2$O$_5$ volatilization. AlP$_3$O$_9$ is available commercially; other metaphosphates can be made using H$_3$PO$_4$ as the source of phosphate. Magnesium nitrate hexahydrate, magnesium carbonate or magnesium hydroxide are useful as the source for magnesium. The salts dissolve easily in 86% H$_3$PO$_4$, forming a clear solution which is then dried for use as a raw material. An alternative method for making mixed magnesium and aluminum metaphosphates in situ is the use of magnesium and aluminum oxides or carbonates and H$_3$PO$_4$ as the raw materials. These can be mixed, dissolved, and pre-reacted at 400°-600° C. for 6-12 hours. Silica can be added during re-grinding process, or with the original solution, provided the silica powder is fine enough and the solution is continuously agitated during drying. The starting materials are mixed in a Y-mill for one hour before loading into either alumina or silica crucibles.

These metaphosphate glasses can be melted at temperatures between 1300° C. and 1450° C. To assure a homogeneous melt, 30 minutes with stirring at the peak temperature is used. A lid is put on the top of the crucible to prevent the evaporation of volatile components.

The melted glass is removed from the furnace and poured onto the surface of water-chilled counter-rotating stainless steel rollers. Thin glass ribbons of the metaphosphate glasses were crushed to reduce the ribbon size for loading into an alumina ball mill jar half-filled with 2.54 cm alumina balls. A small amount of $H_2O_2$ is added to prevent caking during milling. The thin ribbons reduce the total amount of milling time and minimize the degree of contamination.

Wet chemical analyses were done on both 47.5 mole % $AlP_3O_9$/47.5 mole % $MgP_2O_6$/5 mole % $SiO_2$ and 45 mole % $AlP_3O_9$/45 mole % $MgP_2O_6$/5 mole % $SiO_2$/5 mole % $ZnP_2O_6$ glasses melted by using the traditional technique and our new techniques. The results are given in Table 1 below.

TABLE 1A

Analysis of Glasses Prepared Using Conventional Glass Melting

| | Example No. | | | |
|---|---|---|---|---|
| | 1 | | 2 | |
| Composition | Theoretical | Analytical | Theoretical | Analytical |
| | (% wt.) | | | |
| $P_2O_5$ | 78.4 | 72.0 | 77.6 | 71.0 |
| $Al_2O_3$ | 11.3 | 14.4 | 10.7 | 14.0 |
| MgO | 8.9 | 11.9 | 8.4 | 11.3 |
| $SiO_2$ | 1.4 | 1.7 | 1.4 | 1.5 |
| ZnO | — | — | 1.9 | 2.2 |

TABLE 1B

Analysis of Glasses Prepared from Crystalline Metaphosphates

| | Example No. | | | |
|---|---|---|---|---|
| | 3 | | 4 | |
| Composition | Theoretical | Analytical | Theoretical | Analytical |
| | (% wt.) | | | |
| $P_2O_5$ | 78.4 | 78.1 | 77.6 | 77.6 |
| $Al_2O_3$ | 11.3 | 11.3 | 10.7 | 10.8 |
| MgO | 8.9 | 9.3 | 8.4 | 7.9 |
| $SiO_2$ | 1.4 | 1.4 | 1.4 | 1.4 |
| ZnO | — | — | 1.9 | 1.6 |

By comparison of the theoretical and analytical amounts of $P_2O_5$ found in each of the four glasses, it can be seen that glasses made by the conventional method using ammonium phosphates and metal oxides or carbonates (Examples 1 and 2) incurred substantial losses of $P_2O_5$, while the glasses made by applicant's preferred method (Examples 3 and 4) incurred little or no $P_2O_5$ loss due to volatilization. It is critical to control the stoichiometry of metaphosphate glass compositions to ensure that the softening points of the glasses are within the desired range, and that the phases formed upon crystallization of the glasses are primarily low-K metaphosphates.

EXAMPLES 5-7

A series of three simple metaphosphate glasses was prepared from $AlP_3O_9$, $MgP_2O_6$, and $CaP_2O_6$. The physical properties of the glasses were determined and the glasses which had been crystallized at temperatures $> T_c$ were examined to determine the composition of the crystalline phases from each glass.

All of the glasses crystallized with the formation of at least one crystalline species. The $MgP_2O_6$ glass yielded crystallization products containing only one crystalline phase, while the other glasses contained two crystalline species.

The data in Table 2 below show that glasses based on a single metaphosphate are unusable for most electronic applications because their temperatures of crystallization and softening are either too high (Example 7) or too low (Examples 5 and 6). However, the data from Examples 12-25 show that these three basic glasses can be blended together and/or mixed with other constituents to obtain a useful range of TCE and crystallization properties.

TABLE 2

Properties and Crystallization Behavior of Basic Metaphosphate Glasses

| | Example No. | | |
|---|---|---|---|
| | 5 | 6 | 7 |
| | (mole %) | | |
| Composition | | | |
| $AlP_3O_9$ | — | — | 100 |
| $MgP_2O_6$ | 100 | — | — |
| $CaP_2O_6$ | — | 100 | — |
| Physical Properties | | | |
| K | 4.96 | 7.02 | 5.20 |
| Loss (tan d) | .2% | .4% | .2% |
| TCE, ppm/°C. | 8.0 | 9.8 | 6.3 |
| $T_g$, °C. | 540 | 548 | 805 |
| $T_d$, °C. | 590 | 590 | 848 |
| $T_c$, °C. | 780 | 750 | 1077 |
| Crystal Phases Formed | | | |
| $AlP_3O_9$ | | | x |
| $MgP_2O_6$ | x | | |
| $CaP_2O_6$ | | x | |
| $AlPO_4$ | | | x |
| Tromelite (~$Ca_4P_6O_{19}$) | | x | |

EXAMPLES 8-11

A series of six $P_2O_5$/MgO glasses was made by the above-described process in which the concentration of $P_2O_5$ was varied from 35-60 mole %. The crystalline phases formed after heating at temperatures greater than $T_c$ and the properties of the crystallized glasses are given in Table 3 below.

TABLE 3

Effect of Variations in MgO/$P_2O_5$ Ratio on Crystallization Products of Metaphosphate Glasses

| Example | 8 | 9 | 10 | 5 | 11 | 12 |
|---|---|---|---|---|---|---|
| Composition | | | | | | |
| $P_2O_5$, mole % | 35 | 40 | 45 | 50 | 55 | 60 |
| MgO, mole % | 65 | 60 | 55 | 50 | 45 | 40 |
| Properties | | | | | | |
| Tc (°C.) | (1) | 754 | 800 | 780 | — | — |
| Phases Formed | | | | | | |
| $MgP_2O_6$ | (1) | x | x | x | — | — |
| $Mg_2P_2O_7$ | (1) | x | x | — | — | — |

(1) Melt crystallized upon cooling, glass was not formed

The above data show that crystallized glasses containing excess MgO contain small amounts of magnesium pyrophosphate. In general, the crystalline non-metaphosphates have higher K values than the crystalline metaphosphates and/or undesired displacive phase transitions. When the concentration of $P_2O_5$ in the melt is less than about 80% of that needed to maintain the metaphosphate stoichiometry, the glass-forming limit may be reached, and glasses will not be obtained using normal glass-making methods.

On the other hand, glasses containing excess $P_2O_5$ were non-crystallizable and hygroscopic. Overall, the data of Examples 5 and 8-12 indicate that the preferred $P_2O_5$ concentration is 80-100% of that required to maintain the metaphosphate stoichiometry, i.e. one $PO_3^-$ moiety per modifying cation charge.

EXAMPLES 13-16

A series of six $MgP_2O_6/AlP_3O_9$ glasses was prepared in which the proportion of each of the two components was varied from 0-100 mole % and selected physical properties of each glass were measured. These data are given in Table 4 below.

TABLE 4

Effect of Mg/Al Ratio on Properties of $MgP_2O_6/AlP_3O_9$ Glasses

| Example | 5 | 13 | 14 | 15 | 16 | 7 |
|---|---|---|---|---|---|---|
| Composition | | | | | | |
| $AlP_3O_9$, mole % | — | 5 | 25 | 50 | 75 | 100 |
| $MgP_2O_6$, mole % | 100 | 95 | 75 | 50 | 25 | — |
| Properties | | | | | | |
| K | 5.0 | 5.0 | 4.8 | 4.9 | 5.0 | 5.2 |
| Loss (tan d) | .2% | .2% | .2% | .3% | .3% | .3% |
| TCE, ppm/°C. | 8.0 | 6.7 | 7.2 | 6.5 | 6.2 | 6.3 |
| $T_g$, °C. | 540 | 541 | 590 | 600 | 663 | 805 |
| $T_d$, °C. | 590 | 593 | 636 | 636 | 784 | 848 |
| $T_c$, °C. | 780 | 835 | 930 | 940 | 980 | 1077 |
| mg $P_2O_5$ dissolved/g (Chemical durability) | 56.5 | — | <.2 | <.1 | — | <.1 |

A number of conclusions can be drawn from the results of the above-referred tests:
(1) Increasing the amount of $AlP_3O_9$ increases both the glass transition temperature and the softening temperature. Thus, higher amounts of $AlP_3O_9$ generally increase the viscosity of the glass.
(2) The TCE of the glass is lowered with increasing $AlP_3O_9$ content.
(3) Changing the Mg/Al ratio has little effect on the dielectric constant.
(4) The crystallization temperature ($T_c$) increases substantially as the proportion of $AlP_3O_9$ is increased.
(5) The durability of the glasses is greatly enhanced by additions of $AlP_3O_9$.

These data indicate that the most appropriate Mg/Al ratio is within the range of 5-75 mole % $AlP_3O_9$. Too little $AlP_3O_9$ results in non-durable glasses having excessively low viscosities. On the other hand, too little $MgP_2O_6$ results in glasses which are too refractory to sinter properly when they are fired at 850°-950° C.

EXAMPLES 17-20

A series of four glasses was prepared to observe the effect of $CrP_3O_9$ additives. The relevant physical data for these glasses are given in Table 5 below.

TABLE 5

Effect of $CrP_3O_9$ Additions on Properties of $MgP_2O_6/CrP_3O_9$ Glasses

| Example | 5 | 17 | 18 | 19 | 20 |
|---|---|---|---|---|---|
| Composition | | | | | |
| $CrP_3O_9$ | | 5 | 25 | 50 | 75 |
| $MgP_2O_6$ | 100 | 95 | 75 | 50 | 25 |
| Properties | | | | | |
| K | 5.0 | 5.1 | 5.1 | — | — |
| Loss (tan d) | .2% | .2% | .2% | | |
| $T_g$, °C. | 540 | 560 | 606 | (1) | (1) |
| $T_d$, °C. | 590 | 602 | 670 | (1) | (1) |
| $T_c$, °C. | 780 | 842 | 955 | (1) | (1) |

(1) Could not be poured at 1550° C.

The above data shows that the dielectric constant is not significantly changed by even major additions of $CrP_3O_9$. However, the crystallization temperature ($T_c$) and viscosity of the molten glass are increased substantially relative to the $T_c$ and viscosity of $MgP_2O_6$ glass. Furthermore, above 25-30 mole % $CrP_3O_9$, the molten glasses become so viscous they cannot be poured at 1550° C. Though not an essential ingredient, up to 20-25 mole % $CrP_3O_9$ can be a useful additive for the purpose of increasing viscosity and crystallization temperature.

EXAMPLES 21-23

A further series of three glasses was made in which $ZnP_2O_6$ was added to an $AlP_3O_9$ glass in different quantities to observe the effect of $ZnP_2O_6$ on glass properties. As shown in Table 6 below, $ZnP_2O_6$ was effective in reducing both glass viscosity and TCE with little effect on dielectric constant and dielectric loss. Thus, $ZnP_2O_6$, like $CrP_3O_9$, although not an essential component of the glass compositions of the invention, is, however, a useful additive for reducing crystallization temperature and viscosity without adversely affecting the value of K.

TABLE 6

Effect of Zn/Al Ratio on Thermal and Dielectric Properties of $ZnP_2O_6/AlP_3O_9$ Glasses

| Example | 21 | 22 | 23 |
|---|---|---|---|
| Composition | | | |
| $AlP_3O_9$ | 75 | 50 | 25 |
| $ZnP_2O_6$ | 25 | 50 | 75 |
| Properties | | | |
| K | 5.2 | 5.2 | 5.3 |
| Loss (tan d) | .2% | .2% | .3% |
| TCE, ppm/°C. | 5.2 | 4.9 | 4.0 |
| $T_g$, °C. | 696 | 600 | 514 |
| $T_d$, °C. | 751 | 653 | 558 |
| $T_c$, °C. | 910 | 904 | — |

EXAMPLES 24-26

A series of four glasses was prepared to observe the effect of $CaP_2O_6$ on $CaP_2O_6/AlP_3O_9$ glasses. As shown in Table 7 below, $CaP_2O_6$ greatly increased the TCE of the resulting glass and significantly raised the dielectric constant, but decreased the viscosity of the glass only slightly as compared to equivalent amounts of $MgP_2O_6$ (see Table 4).

TABLE 7

Effect of Ca/Al Ratio on Thermal and Dielectric Properties of $CaP_2O_6/AlP_3O_9$ Glasses

| Example | 24 | 25 | 26 | 6 |
|---|---|---|---|---|
| Composition | | | | |
| $AlP_3O_9$ | 75 | 50 | 25 | — |
| $CaP_2O_6$ | 25 | 50 | 75 | 100 |
| Properties | | | | |
| K | 5.2 | 5.5 | 5.5 | 7.0 |
| Loss (tan d) | .4% | .3% | .3% | .3% |
| TCE, ppm | 7.8 | 8.2 | 9.5 | 9.8 |
| $T_g$ | 676 | 610 | 611 | 548 |
| $T_d$ | 735 | 670 | 660 | 590 |

TABLE 7-continued

Effect of Ca/Al Ratio on Thermal and
Dielectric Properties of CaP$_2$O$_6$/AlP$_3$O$_9$ Glasses

| Example | 24 | 25 | 26 | 6 |
|---|---|---|---|---|
| T$_c$ | 930 | 840 | 860 | 741 |

EXAMPLES 27-38

A series of 12 glasses was prepared in which various glass modifiers were added to MgP$_2$O$_6$ glass at two concentration levels, 0.5 and 5.0 mole %. The physical properties of the glasses are given in Table 8 below.

TABLE 8

Effect of Additions of Glass Modifiers on
Thermal Properties of MgP$_2$O$_6$ Glass

| Example | 27/28 | 29/30 | 31/32 | 33/34 | 35/36 | 37/38 | 5 |
|---|---|---|---|---|---|---|---|
| Additive | CrP$_3$O$_9$ | ZrP$_4$O$_{12}$ | LiPO$_3$ | AlP$_3$O$_9$ | FeP$_3$O$_9$ | YP$_3$O$_9$ | none (MgP$_2$O$_6$) |
| Properties | | | | | | | |
| T$_g$, 0.5 mole % | 545 | 540 | 537 | 542 | 533 | 540 | 540 |
| T$_d$, 0.5 mole % | 590 | 582 | 583 | 592 | 580 | 589 | 590 |
| T$_c$, 0.5 mole % | 786 | 787 | 780 | 806 | 784 | 806 | 780 |
| T$_g$, 5 mole % | 560 | 554 | 523 | 550 | 538 | 553 | |
| T$_d$, 5 mole % | 602 | 601 | 560 | 595 | 584 | 603 | |
| T$_c$, 5 mole % | 842 | 835 | 763 | 835 | 811 | 826 | |

The above data show that the trivalent and tetravalent modifiers increased viscosity and crystallization temperature and decreased TCE. However, monovalent and most divalent modifiers decreased viscosity and increased TCE. Nevertheless, none of the modifiers changed the essential properties of the glasses when added at the 0.5 mole % level. This indicates that the glass system is resistant to impurities below about the 1 mole % level.

EXAMPLES 39-42

A still further series of four glasses was prepared in which SiO$_2$ and B$_2$O$_3$, both glass formers, were added to an MgP$_2$O$_6$ glass to observe their effect on glass properties. The data in Table 9 below show that the B$_2$O$_3$ raises T$_g$ and T$_d$ slightly. Consequently, B$_2$O$_3$ can be used in the glasses of the invention at levels up to 10 mole % without significantly changing the bulk thermal properties of the glass.

On the other hand, the SiO$_2$ increased the viscosity of the glass only slightly, but increased the crystallization temperatures significantly. Examination of these SiO$_2$-containing glasses and other MgP$_2$O$_6$ glasses containing no SiO$_2$ show that if there is no SiO$_2$ present, crystallization is essentially 100%, but if 0.5-10 mole % SiO$_2$ is added, crystallization is less than 100% and there is remnant glass present. The presence of remnant glass is desirable in order to improve the hermeticity and adhesion of fired parts made from these glasses.

The data thus show that SiO$_2$ can be an important additive in that it increases the difference between softening and crystallization temperatures without an adverse affect on other glass properties. The optimum range of SiO$_2$ addition seems to be 5-15 mole %.

TABLE 9

Effect of Addition of B$_2$O$_3$ and SiO$_2$ on
Thermal Properties of MgP$_2$O$_6$ Glass

| Example | 5 | 39 | 40 | 41 | 42 |
|---|---|---|---|---|---|
| Composition | | | | | |
| SiO$_2$ | 0 | 0.5 | 5.0 | — | — |
| B$_2$O$_3$ | 0 | — | — | 0.5 | 5.0 |
| MgP$_2$O$_6$ | 100 | 99.5 | 95.0 | 99.5 | 95.0 |
| Properties | | | | | |
| T$_g$, °C. | 540 | 542 | 547 | 560 | 559 |
| T$_d$, °C. | 590 | 578 | 586 | — | — |
| T$_c$, °C. | 780 | 815 | 844 | 791 | 792 |

EXAMPLES 43 AND 44

Two further devitrifiable metaphosphate glasses were made to compare the TCE and K values both for the amorphous glasses and for the crystallized glasses. As shown in Table 10, the TCE's of the crystallized glasses were substantially higher than those of the amorphous (as-made) glasses. However, the dielectric constants of both the uncrystallized and crystallized glasses were substantially the same.

TABLE 10

Comparison of TCE and K of
Amorphous and Crystallized
Metaphosphate Glasses

| Example | 43 | 44 |
|---|---|---|
| Composition (Mole %) | | |
| AlP$_3$O$_9$ | 47.5 | 47.5 |
| MgP$_2$O$_6$ | 47.5 | 47.5 |
| SiO$_2$ | 5.0 | — |
| ZnP$_2$O$_6$ | — | 5.0 |
| Properties | | |
| TCE-Amorphous Glass (ppm/°C.) | 6.5 | 6.4 |
| TCE-Crystallized Glass (ppm/°C.) | 9.0 | 9.2 |
| K-Amorphous Glass | 4.9 | 4.9 |
| K-Crystallized Glass | 4.9 | 4.8 |

EXAMPLES 45-54

A variety of fillers were added to the glass shown in Example 43 to demonstrate the effect of the fillers on K and TCE. As shown in Table 11, fillers can be used to adjust the TCE of the filled glass composites from 4.6 to 8 and K from 4.2 to 6.5.

TABLE 11

Effect of Filler Additions On Properties of Metaphosphate Glasses

| | Example | | | | | | | | | |
|---|---|---|---|---|---|---|---|---|---|---|
| | 45 | 46 | 47 | 48 | 49 | 50 | 51 | 52 | 53 | 54 |
| | | | | | (% weight) | | | | | |
| Composition | | | | | | | | | | |
| Metaphosphate Glass | 60 | 60 | 60 | 60 | 60 | 50 | 50 | 50 | 65 | 85 |
| Fused SiO$_2$ | 40 | | | | | 50 | 40 | | | |
| Quartz | | 40 | | | | | 10 | | | |
| Cordierite | | | 40 | | | | | | | |
| Corning 7070 glass | | | | | | | | 50 | | |
| AlPO$_4$ (berlinite) | | | | 40 | | | | | | |
| AlP$_3$O$_9$ | | | | | 40 | | | | | |
| AlN | | | | | | | | | 35 | |
| BN | | | | | | | | | | 15 |
| Properties | | | | | | | | | | |
| TCE, ppm/°C. | 5.0 | 7.1 | 5.7 | 7.5 | 6.6 | 4.6 | 5.5 | 5.3 | 6.8 | 8.1 |
| K | 4.3 | 4.2 | 5.0 | 4.2 | 4.8 | 4.3 | 4.2 | 4.4 | 6.5 | 4.7 |

We claim:

1. A thick film composition comprising finely divided particles of an amorphous crystallizable glass having a softening point of 550°-800° C. and a dielectric constant less than about 5.8, consisting essentially by mole % of:
   41-70% P$_2$O$_5$;
   10-48% MgO, ZnO or mixtures thereof;
   2-20% Al$_2$O$_3$, Cr$_2$O$_3$ or mixtures thereof;
   0-10% alkali metal oxide(s);
   0-10% CaO, SrO, BaO or mixtures thereof;
   0-10% SiO$_2$;
   0-20% B$_2$O$_3$;
   0-10% ZrO$_2$, TiO$_2$ or mixtures thereof; and
   0-10% Fe$_2$O$_3$ with the provisos that:
   (i) a=n(b+3c+d+e+2f+3g), wherein n=0.8-1.0, and
      a=mole % P$_2$O$_5$;
      b=mole % MgO, ZnO or mixtures thereof;
      c=mole % Al$_2$O$_3$, Cr$_2$O$_3$ or mixtures thereof;
      d=mole % M$_2$O, where M=Na, K, Rb, Cs
      e=mole % M'O, where M'=Ca, Sr, Ba
      f=mole % ZrO$_2$, TiO$_2$ or mixtures thereof;
      g=mole % Fe$_2$O$_3$;
   (ii) the total amount of alkali oxides, CaO, SrO, and BaO does not exceed 10 mole %;
   (iii) the total amount of ZrO$_2$, TiO$_2$, Fe$_2$O$_3$ does not exceed 10 mole %
   dispersed in an organic medium.

2. A dielectric layer comprising a layer of the thick film composition of claim 1 printed upon a substrate, which layer has been fired at 850°-900° C. to effect volatilization of the organic medium and crystallization of metaphosphates from the glass.

3. A green tape comprising finely divided particles of an amorphous crystallizable glass having a softening point 550°-800° C. and a dielectric constant less than about 5.8, consisting essentially by mole % of:
   41-70% P$_2$O$_5$;
   10-48% MgO, ZnO or mixtures thereof;
   2-20% Al$_2$O$_3$, Cr$_2$O$_3$ or mixtures thereof;
   0-10% alkali metal oxide(s);
   0-10% CaO, SrO, BaO or mixtures thereof;
   0-10% SiO$_2$;
   0-20% B$_2$O$_3$;
   0-10% ZrO$_2$, TiO$_2$ or mixtures thereof; and
   0-10% Fe$_2$O$_3$ with the provisos that:
   (i) a=n(b+3c+d+e+2f+3g), wherein n=0.8-1.0, and
      a=mole % P$_2$O$_5$;
      b=mole % MgO, ZnO or mixtures thereof;
      c=mole % Al$_2$O$_3$, Cr$_2$O$_3$ or mixtures thereof;
      d=mole % M$_2$O, where M=Na, K, Rb, Cs
      e=mole % M'O, where M'=Ca, Sr, Ba
      f=mole % ZrO$_2$, TiO$_2$ or mixtures thereof;
      g=mole % Fe$_2$O$_3$;
   (ii) the total amount of alkali oxides, CaO, SrO, and BaO does not exceed 10 mole %;
   (iii) the total amount of ZrO$_2$, TiO$_2$, Fe$_2$O$_3$ does not exceed 10 mole %
   dispersed in an organic polymer matrix.

4. A dielectric layer comprising at least one layer of the green tape of claim 3, which layer has been fired at 850°-900° C. to effect volatilization of the organic medium and crystallization of metaphosphates from the glass.

* * * * *